US010153559B1

(12) United States Patent
Jandzio et al.

(10) Patent No.: US 10,153,559 B1
(45) Date of Patent: Dec. 11, 2018

(54) MODULAR CENTER FED REFLECTOR ANTENNA SYSTEM

(71) Applicant: HARRIS CORPORATION, Melbourne, FL (US)

(72) Inventors: Gregory M. Jandzio, Melbourne Village, FL (US); Timothy L. Fetterman, Palm Bay, FL (US); Jay D. Warshowsky, Melbourne Beach, FL (US)

(73) Assignee: Harris Corporation, Melbourne, FL (US)

( * ) Notice: Subject to any disclaimer, the term of this patent is extended or adjusted under 35 U.S.C. 154(b) by 282 days.

(21) Appl. No.: 15/191,274

(22) Filed: Jun. 23, 2016

(51) Int. Cl.
  *H01Q 15/16* (2006.01)
  *H01Q 1/28* (2006.01)
  *G01R 29/10* (2006.01)
  *H01Q 15/18* (2006.01)
  (Continued)

(52) U.S. Cl.
  CPC .......... *H01Q 15/161* (2013.01); *G01R 29/10* (2013.01); *G01R 29/105* (2013.01); *H01Q 1/08* (2013.01); *H01Q 1/084* (2013.01); *H01Q 1/288* (2013.01); *H01Q 15/16* (2013.01); *H01Q 15/162* (2013.01);
  (Continued)

(58) Field of Classification Search
  CPC .......... H01Q 1/288; H01Q 1/08; H01Q 1/084; H01Q 15/16; H01Q 15/161; H01Q 15/162; H01Q 15/163; H01Q 15/165; H01Q 15/167; H01Q 15/168; H01Q 21/00; H01Q 21/0018; H01Q 21/0025; H01Q 21/0006; H01Q 21/0087; H01Q 21/0093; H01Q 19/10; H01Q 19/102; H01Q 19/104; H01Q 19/106; H01Q 19/108; H01Q 19/12; H01Q 19/13; H01Q 19/19; H01Q 19/191; H01Q 19/192; H01Q 19/193; G01R 29/10; G01R 29/105
  See application file for complete search history.

(56) References Cited

U.S. PATENT DOCUMENTS 3,064,534 A * 11/1962 Tumavicus ............ B64G 1/222
  359/853
3,176,303 A * 3/1965 Holland ............... H01Q 15/161
  343/881

(Continued)

FOREIGN PATENT DOCUMENTS

CA     2859620 A1 *  6/2013 ............ H02S 20/32
WO   WO 0154228 A1 *  7/2001 ............ B64G 1/222
WO   WO 2010144831 A2 * 12/2010 ............ H01Q 15/16

*Primary Examiner* — Dameon E Levi
*Assistant Examiner* — Ab Salam Alkassim, Jr.
(74) *Attorney, Agent, or Firm* — Fox Rothschild LLP; Robert J. Sacco; Carol E. Thorstad-Forsyth (57) ABSTRACT

Antenna system includes an elongated antenna feed tower structure having a tower base at one end which includes a plurality of feet arranged to align with a plurality of predetermined structural mounting points associated with a space vehicle bus. The antenna system also includes a deployable reflector assembly comprising a hub ring. The hub ring includes a reflector deployment mechanism around which a plurality of reflector ribs are disposed. The hub ring is advantageously arranged to engirdle the feed tower assembly. As such, the central aperture is configured to receive the feed tower assembly therein after the feed tower has already been mounted to the space vehicle.

20 Claims, 8 Drawing Sheets

(51) Int. Cl.
*H01Q 15/20* (2006.01)
*H01Q 1/08* (2006.01)

(52) U.S. Cl.
CPC ........... *H01Q 15/163* (2013.01); *H01Q 15/18* (2013.01); *H01Q 15/20* (2013.01)

(56) References Cited

U.S. PATENT DOCUMENTS

| | | | | |
|---|---|---|---|---|
| 3,217,328 A * | 11/1965 | Miller | H01Q 15/161 | 343/840 |
| 3,286,259 A * | 11/1966 | Carman | H01Q 15/161 | 342/10 |
| 3,521,290 A * | 7/1970 | Bahiman | B64G 1/22 | 244/1 R |
| 3,540,048 A * | 11/1970 | Clemens, Jr. | H01Q 15/161 | 244/1 R |
| 3,680,144 A * | 7/1972 | Low | H01Q 1/288 | 343/781 R |
| 3,714,660 A * | 1/1973 | Scrafford | H01Q 1/125 | 343/757 |
| 3,715,760 A * | 2/1973 | Palmer | H01Q 15/162 | 343/915 |
| 3,725,946 A * | 4/1973 | Quequen | H01Q 15/161 | 343/912 |
| 3,780,375 A * | 12/1973 | Cummings | H01Q 15/161 | 343/840 |
| 3,832,717 A * | 8/1974 | Taggart, Jr. | H01Q 15/162 | 343/840 |
| 3,978,490 A * | 8/1976 | Fletcher | H01Q 15/161 | 343/882 |
| 4,201,991 A | 5/1980 | Vines | | |
| 4,249,184 A * | 2/1981 | Vines | H01Q 15/161 | 343/840 |
| 4,314,253 A * | 2/1982 | Sayovitz | H01Q 15/162 | 343/765 |
| 4,475,323 A * | 10/1984 | Schwartzberg | H01Q 15/161 | 343/881 |
| 4,506,271 A * | 3/1985 | Gonzalez | H01Q 15/162 | 343/915 |
| 4,527,166 A * | 7/1985 | Luly | H01Q 15/161 | 343/840 |
| 4,608,571 A * | 8/1986 | Luly | H01Q 15/161 | 343/781 P |
| 4,609,923 A * | 9/1986 | Boan | H01Q 15/161 | 343/897 |
| 4,645,358 A * | 2/1987 | Blume | G01K 11/006 | 250/341.6 |
| 4,683,475 A * | 7/1987 | Luly | H01Q 15/161 | 343/915 |
| 4,811,033 A * | 3/1989 | Ahl | H01Q 15/147 | 343/880 |
| 4,899,167 A * | 2/1990 | Westphal | H01Q 15/162 | 343/912 |
| 5,257,034 A * | 10/1993 | Turner | H01Q 15/161 | 343/840 |
| 5,307,082 A * | 4/1994 | Silverberg | G02B 26/0825 | 343/915 |
| 5,446,474 A * | 8/1995 | Wade | H01Q 15/161 | 343/912 |
| 5,488,383 A * | 1/1996 | Friedman | H01Q 15/147 | 112/475.08 |
| 5,557,292 A * | 9/1996 | Nygren | H01Q 1/288 | 343/753 |
| 5,635,946 A * | 6/1997 | Francis | H01Q 15/161 | 343/881 |
| 5,773,108 A * | 6/1998 | Casebolt | B29C 70/342 | 156/169 |
| 5,898,529 A * | 4/1999 | Meyer | G02B 23/00 | 343/781 P |
| 6,028,569 A * | 2/2000 | Bassily | H01Q 1/288 | 343/915 |
| 6,037,909 A * | 3/2000 | Cherrette | H01Q 1/002 | 343/700 MS |
| 6,104,358 A * | 8/2000 | Parker | H01Q 15/161 | 343/915 |
| 6,138,998 A * | 10/2000 | Parker | B64G 1/36 | 188/267.1 |
| 6,219,009 B1 * | 4/2001 | Shipley | H01Q 1/288 | 343/912 |
| 6,288,683 B1 * | 9/2001 | Deguchi | H01Q 3/20 | 342/360 |
| 6,340,956 B1 * | 1/2002 | Bowen | H01Q 15/161 | 343/840 |
| 6,344,835 B1 * | 2/2002 | Allen | H01Q 1/288 | 343/912 |
| 6,930,654 B2 * | 8/2005 | Schmid | B64G 1/222 | 343/912 |
| 7,557,995 B1 * | 7/2009 | Lloyd | G02B 23/16 | 359/601 |
| 7,728,782 B2 | 6/2010 | Watson et al. | | |
| 7,782,530 B1 * | 8/2010 | Krumel | G02B 17/061 | 343/915 |
| 8,289,221 B1 * | 10/2012 | Finucane | H01Q 1/08 | 343/781 R |
| 9,112,282 B2 * | 8/2015 | Nurnberger | H01Q 15/16 | |
| 9,608,333 B1 * | 3/2017 | Toledo | H01Q 15/161 | |
| 9,755,318 B2 * | 9/2017 | Mobrem | H01Q 15/168 | |
| 2006/0220950 A1 * | 10/2006 | Morgan | G01R 29/105 | 342/165 |
| 2007/0069970 A1 * | 3/2007 | Argaman | H01Q 15/162 | 343/840 |
| 2007/0109212 A1 * | 5/2007 | Wu | H01Q 19/19 | 343/781 CA |
| 2007/0200790 A1 * | 8/2007 | Bassily | H01Q 15/161 | 343/915 |
| 2009/0002257 A1 * | 1/2009 | de Jong | B64G 1/222 | 343/872 |
| 2010/0039332 A1 * | 2/2010 | Dybdal | G01R 29/105 | 343/703 |
| 2010/0103073 A1 * | 4/2010 | Texier | H01Q 1/1235 | 343/880 |
| 2011/0187627 A1 * | 8/2011 | Palmer | H01Q 15/161 | 343/915 |
| 2012/0154585 A1 * | 6/2012 | Miranda | B64G 1/1021 | 348/E7.085 |
| 2013/0069849 A1 * | 3/2013 | Toledo | H01Q 15/162 | 343/915 |
| 2013/0141307 A1 * | 6/2013 | Nurnberger | H01Q 15/16 | 343/912 |
| 2014/0152492 A1 * | 6/2014 | Zimmerman | H01Q 15/162 | 342/352 |
| 2014/0263844 A1 * | 9/2014 | Cook, Jr. | B64G 1/222 | 244/164 |
| 2015/0009085 A1 * | 1/2015 | Lawrence | H01Q 19/13 | 343/840 |
| 2015/0069187 A1 * | 3/2015 | McKinnon | B64G 1/50 | 244/171.8 |
| 2015/0349430 A1 * | 12/2015 | Nurnberger | H01Q 15/162 | 343/915 |
| 2016/0156107 A1 * | 6/2016 | Lee | H01Q 15/162 | 343/840 |
| 2016/0352022 A1 * | 12/2016 | Thomson | H01Q 19/19 | |
| 2016/0365630 A1 * | 12/2016 | Rao | H01Q 3/20 | |
| 2017/0201031 A1 * | 7/2017 | Gelb | H01Q 1/288 | |
| 2017/0256840 A1 * | 9/2017 | Walker | H01Q 1/082 | |
| 2017/0365932 A1 * | 12/2017 | Spirtus | H01Q 15/147 | |
| 2018/0048059 A1 * | 2/2018 | Greschik | H01Q 1/08 | |

\* cited by examiner

MODULAR CENTER FED REFLECTOR ANTENNA SYSTEM

BACKGROUND OF THE INVENTION

Statement of the Technical Field

The inventive arrangements relate to satellite communication systems and more particularly to reflector systems used in satellite communication systems.

Description of the Related Art

A reflector dish (such as a parabolic reflector) is commonly used as part of a reflector antenna in a radio frequency communications system. Such reflector antennas are conventionally comprised of a reflector (e.g. a parabolic reflector) portion and a feed portion. The feed is usually suspended in front of the reflector at its focus. The feed commonly includes a waveguide assembly such as a small horn that is used to direct RF energy rearwardly toward the reflector. The reflector reflects the energy back toward the feed in a forward direction toward a remote receiving station. The same process is applied in reverse for receiving signals from a remote transmitting station. In a conventional center-fed reflector antenna, the feed is located at a focal center of the reflector. In an off-axis or offset fed reflector antenna, the feed is located to one side of the reflector dish so as to move the feed structure out of the beam path. In a reflector dish type antenna as described herein, a tower assembly is sometimes used to support the feed in position at the focus of the reflector.

Reflector dish antennas as described herein are commonly used on various kinds of spacecraft such as communication satellites. Reflectors used for spacecraft must be designed so that they can be compactly stored within a launch vehicle for transport to an on-orbit location. Accordingly, various deployment mechanisms have been designed and developed to facilitate automatic deployment of the reflector when it reaches a desired location in orbit. For example, a conventional deployment mechanism can involve a plurality of ribs which are positioned during transport in a direction generally aligned with a central axis of the reflector. When the reflector is to be deployed in space, the deployment mechanism causes each of the ribs to rotate about a pivot point so that they extend radially. A reflector surface can be attached to the ribs such that the pivot motion causes the reflector surface to unfurled and form the required reflector surface.

Conventional deployable center fed reflector antennas usually include a structural hub and an integral tower assembly which is mounted to the structural hub. The structural hub is conventionally comprised of some type of mechanical structure, such as a lattice truss structure which supports the reflector deployment mechanism. As noted above, the deployment mechanism can be used to extend a plurality of antenna ribs or panels. One or more legs comprising the integral tower assembly will commonly extend through the lattice truss structure which forms the structural hub. The integral tower assembly supports the antenna feed (e.g. at a reflector focal point). The legs of the tower assembly are secured to engagement or securing points within the lattice truss structure. The structural hub then serves as the attachment structure which is used to secure the entire antenna system to the spacecraft.

SUMMARY OF THE INVENTION

Embodiments of the invention concern a method for integration of a space vehicle with a reflector antenna. The method involves mounting to a space vehicle bus an antenna feed tower for a reflector antenna assembly. At least a first electronics assembly disposed on the antenna feed tower is then integrated with at least a second electronics assembly disposed in the space vehicle bus to form an integrated space vehicle electronics system. Thereafter, functional testing is performed of the integrated space vehicle electronics system. Upon completion of such testing a hub ring of a deployable antenna reflector is positioned to engirdle the antenna feed tower. For example, the hub ring can extend exclusively around an outer periphery of the antenna feed tower. The method can further involve structurally securing the hub ring to the antenna feed tower. The securing step is advantageously performed exclusive of disassembly of the integrated space vehicle electronics assembly.

According to a further aspect, the invention concerns a modular center fed reflector antenna system. The system includes a feed tower assembly for a deployable reflector antenna. The feed tower assembly is comprised of an elongated antenna feed tower structure having a tower base at one end which includes a plurality of feet. The feet are arranged to align with a plurality of predetermined structural mounting points associated with a space vehicle bus. The antenna system can include at least a first electronics assembly disposed on a portion of the elongated antenna feed tower structure opposed from the tower base. The first electronics assembly is configured to integrate with at least a second electronics assembly provided in the space vehicle bus to facilitate operation of a reflector antenna system.

The antenna system also includes a deployable reflector assembly comprising a hub ring. The hub ring includes a reflector deployment mechanism around which a plurality of reflector ribs are disposed to pivot when the deployable reflector is to be deployed. The hub ring is advantageously arranged to engirdle the feed tower assembly. In this regard, the hub ring has a central aperture free of obstructions. As such, the central aperture is configured to receive the feed tower assembly therein after the feed tower has already been mounted to the space vehicle. According to one aspect, the hub ring extends exclusively around an outer periphery of the tower base. An embodiment hub ring can include a plurality of hub ring structural attachment sites disposed around an inner peripheral portion of the hub ring. The hub ring structural attachment sites are arranged to align with a plurality of tower structural attachment sites disposed around an outer periphery of the antenna feed tower to facilitate attachment of the hub ring to the antenna feed tower structure.

The inventive arrangements also comprise a space vehicle. The space vehicle includes a space vehicle bus and a modular center fed reflector antenna system as described above. A feed tower assembly as described above includes a plurality of feet attached to the space vehicle bus at a plurality of predetermined tower structural mounting points associated with the space vehicle bus. The space vehicle also includes a deployable reflector assembly comprising a hub ring which includes a reflector deployment mechanism. A plurality of reflector ribs are disposed to pivot about the hub ring when the deployable reflector is to be deployed. The hub ring engirdles the feed tower assembly and has a central aperture free of obstructions, whereby the central aperture is configured to receive the feed tower assembly therein after the feed tower has already been mounted to the space vehicle.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. However, the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

A deployable center fed reflector antenna includes a structural hub and a tower assembly. The tower assembly supports the antenna feed (e.g. at a reflector focal point). In the past, the antenna feed used in deployable center fed reflector antennas has been a relatively simple arrangement comprised mainly of passive components, such as a waveguide and associated feed horn. But in recent years, there has been an increasing interest in active feeds with more electronics disposed on the tower assembly. This trend has impacted antenna program costs and complexity. The reason for this is mainly due to the manner in which space vehicle testing is performed.

In particular, it is desirable when testing a space vehicle to proceed with all electronics fully integrated into the spacecraft so that the system can be tested as a whole. In the past, this has not been a significant issue because the antenna system (including the feed) was mainly a passive element and not required for such testing. But with the increasing trend toward active feeds and more electronics disposed on the tower assembly, it has now become necessary to include the tower electronics as part of the overall spacecraft testing. So in order for spacecraft testing to proceed, the antenna tower assembly must now be installed on the spacecraft bus during such testing procedures. This requirement substantially increases program cost and schedule. As used herein, the term bus or spacecraft bus is used to refer to the primary infrastructure of a spacecraft, including a physical structure or chassis which defines locations where one or more electronic system payloads can be disposed. The bus can also include electronics, wiring and power systems which are necessary or desirable to support the operation of the various electronic payloads.

The need to provide the antenna assembly mounted to the spacecraft during testing presents several difficulties. For example, when the antenna assembly is mounted to the spacecraft, the complete assembly often will not fit within an existing environmental chamber where testing is to be performed. Also, testing of the spacecraft cannot proceed with completed antenna assembly. So the availability of the entire antenna assembly, including the deployable reflector, becomes a critical factor for proceeding with the assembly and testing of the overall space vehicle. Partial testing of the system requires integration and subsequent removal of the reflector electronics several times, with flight hardware shipped back and forth between the assembly locations for the spacecraft and the antenna system. So the presence of increasing amounts of electronics on the tower assembly has complicated integration and test times, not only at the tower level but at the reflector level as well.

In order to overcome these and other deficiencies of conventional spacecraft assembly and reflector systems, a tower assembly in a deployable reflector antenna system is reconfigured so that it is no longer an integral component of the deployable reflector part of the antenna assembly. The reflector assembly is a passive device that does not need to be present to facilitate testing of a space vehicle. The tower assembly can include active feeds and other electronics. So redesigning the antenna system so the tower assembly is no longer an integrated part of the reflector assembly allows each to be built test and delivered separately. The tower assembly (with its various electronics) can then be integrated with the space vehicle without the reflector assembly in place to facilitate complete space vehicle system testing prior to launch; with all electrical connections established and verified through all environments.

The basic concept described above is illustrated in FIGS. 1-3 which show an embodiment of a deployable center-fed reflector antenna system 100 for a space vehicle. The antenna system 100 is comprised of a deployable reflector assembly 102 and a tower assembly 106. In the embodiment shown, the deployable reflector assembly 102 is comprised of a toroidal shaped hub ring 104 and a plurality of ribs 103. In an exemplary embodiment, the plurality of ribs 103 are respectively secured to the hub ring 104 by means of a plurality of rotatable pivot members 110 which are associated with a reflector deployment mechanism. A conductive mesh material 108 is attached to the plurality of ribs to facilitate reflection of radio frequency signals.

The tower assembly 106 is comprised of a plurality of tower legs 112 which support a feed platform 114 on which an antenna feed and various electronics sub-assemblies can be disposed. The antenna feed and electronics assemblies are omitted in FIGS. 1-3 for greater clarity and understanding of the inventive arrangements. However, it should be understood that the electronics assemblies disposed on the feed tower in the various embodiments described herein can include active systems which are used to support the operation of a phased array fed reflector. As used herein, an active device is one which has the ability to electrically control electron flow. Such active systems are to be distinguished from passive electronic structures such as simple waveguide horns and feeds. A plurality of tower feet 116 are respectively disposed on the ends of the tower legs 112 to facilitate attachment of the tower to a space vehicle (not shown in FIGS. 1-3).

Figure 1:
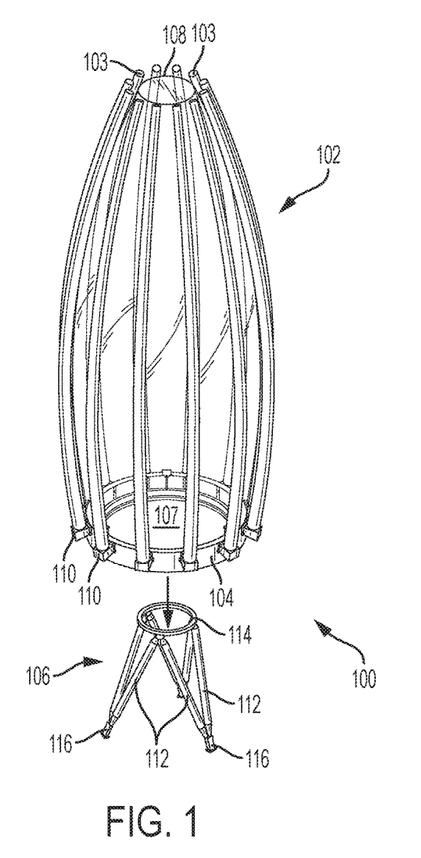
FIG. 1 is a drawing which is useful for understanding how an antenna reflector assembly of a deployable reflector antenna system can be positioned over and around an associated feed tower.
Figure 2:
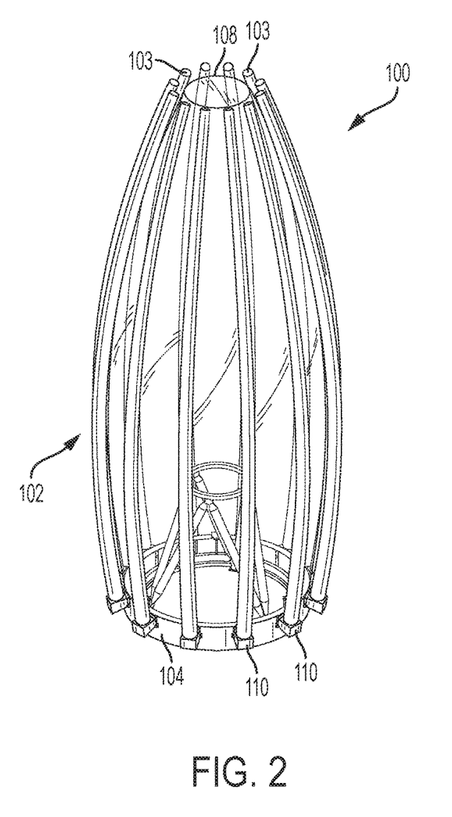
FIG. 2 is a drawing which shows the deployable reflector antenna system of FIG. 1 after an antenna reflector is mounted on the feed tower.
Figure 3:
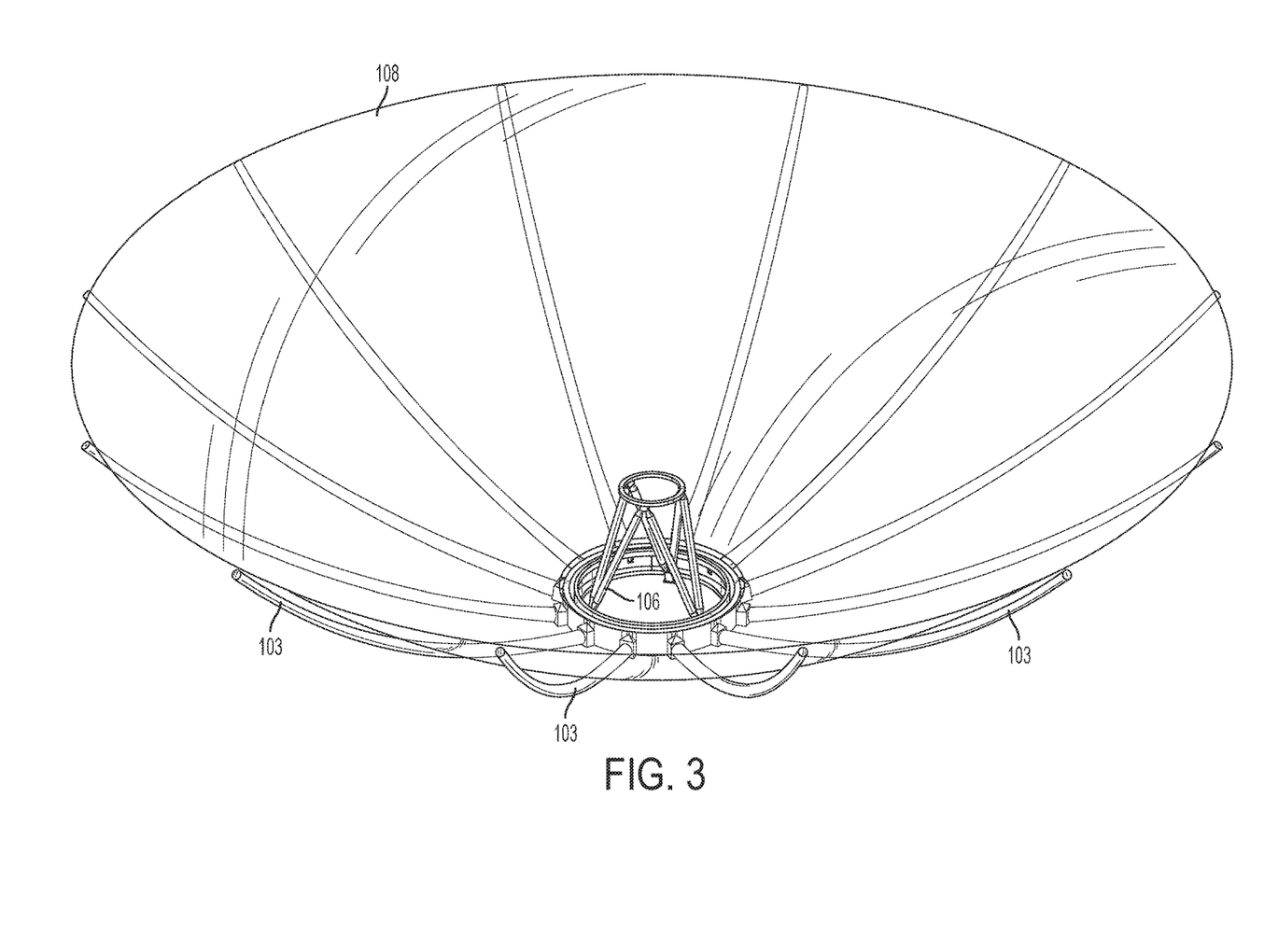
FIG. 3 is a drawing which shows the deployable reflector antenna system of FIG. 1 in a configuration wherein the reflector is deployed.

The hub ring 104 and the tower assembly 106 are designed so that hub ring engirdles the tower assembly. As used herein, the term engirdle can be understood to mean that the hub ring encircles or surrounds the tower assembly. In an embodiment described herein, the hub ring extend exclusively around an outer periphery of the antenna feed tower such that the legs of the tower do not intersect or interfere with any portion of the hub ring. According to one aspect, the tower assembly fits within the inner diameter of the hub ring aperture 107 as shown. Further, the hub ring 104 is configured so that a plurality of hub ring structural mounting points are provided which align with hub ring structural support elements disposed on the legs 112 or feet 116 of the tower assembly 106. At the appropriate time, the plurality of ribs 103 can be pivoted as shown in FIG. 3 to deploy the reflector. As may be observed in FIG. 3, the hub ring is functionally separate from the tower assembly such that the testing of the reflector antenna, including the deployment mechanism, is independent of the tower assembly structure and its associated electronics.

With the arrangement as described herein with respect to FIGS. 1 and 2, the tower assembly 106 with its associated antenna feed and electronics sub-assemblies can be mounted to a spacecraft bus to facilitate full-system electronics testing of the spacecraft. Such testing can be performed without the presence of the reflector assembly 102. Accordingly, the development, manufacture and testing of the reflector assembly 102 can be proceed separately and independent of the spacecraft bus and electronics assemblies disposed therein. Moreover, the full spacecraft system electronics testing (including electronics sub-assemblies associated with the spacecraft bus and the tower) can proceed without the presence of the reflector assembly. This is a great advantage for those instances where active antenna feed and various other electronics assemblies are necessary on the tower assembly. Decoupling of the spacecraft bus/tower assembly from the antenna reflector in this way establishes separable entities, such that each can be built, tested and delivered at appropriate times.

Figure 4:
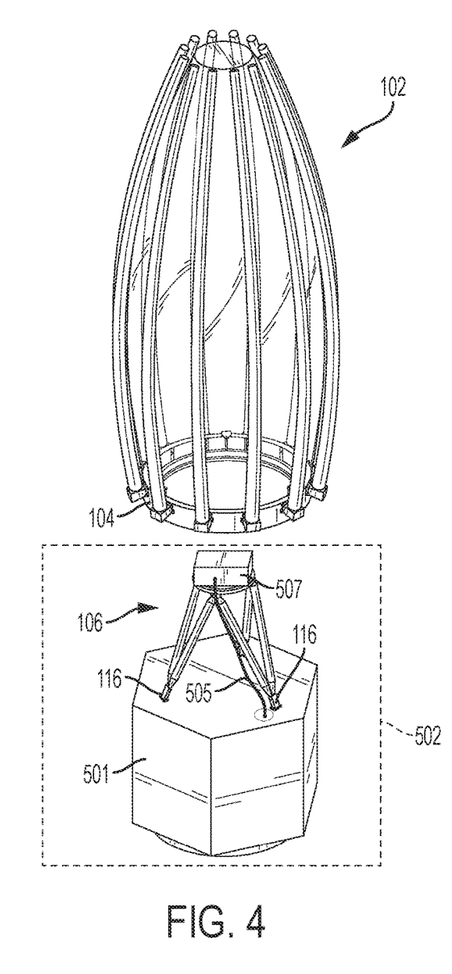
FIG. 4 is a drawing of a space vehicle assembly process which is useful for understanding how an antenna reflector assembly of a deployable reflector antenna system can be positioned over and around an associated feed tower after the feed tower has been mounted to the spacecraft bus for functional testing.

Referring now to FIG. 4, it can be observed that the securement of a tower assembly 106 to a spacecraft can involve a direct structural mounting of the tower to attachment points disposed on a spacecraft bus 501. For example, the tower assembly 106 can be secured by its plurality of feet 116 to a spacecraft bus 501 at a plurality of structural mounting points disposed on the spacecraft. The tower assembly 106 can include one or more electronics sub-assembly 507. According to one aspect, the electronics sub-assembly can include various electronic components. Exemplary electronics components that can be included without limitation include an active antenna feed for the reflector antenna and other associated electronic modules which function as part of a complete reflector antenna system. One or more electronic or RF coupling cables 505 can be provided to electrically connect the electronics sub-assembly 507 to the spacecraft bus 501 to form an integrated space vehicle electronics system 502 for all vehicle level testing, including electrical functional and environmental tests. Notably, such testing can take place in parallel with the development, assembly and testing of a deployable reflector 102.

Figure 5:
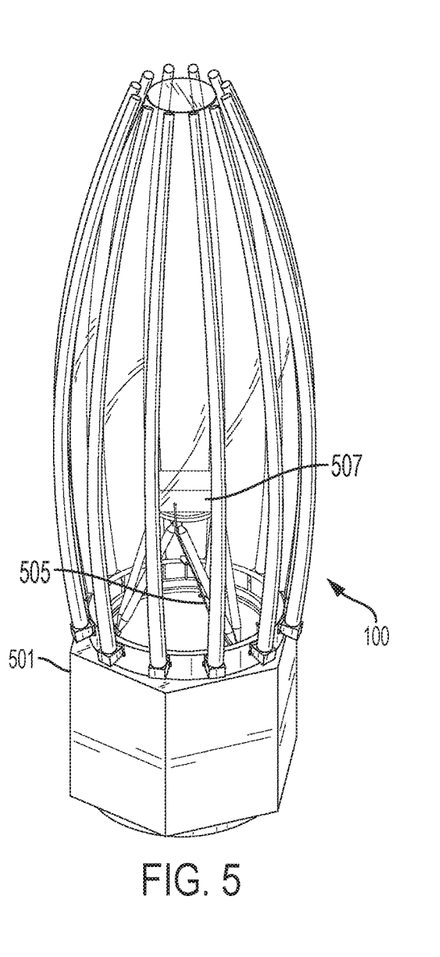
FIG. 5 is a drawing which shows the deployable reflector antenna system of FIG. 4 after an antenna reflector is mounted on the feed tower.

At the appropriate time, the deployable reflector 102 can be mounted to the completed space vehicle electronics system 502 as shown in FIG. 5. More particularly, the tower assembly 106 can be inserted through the aperture 107 defined by the hub ring 104, after which the hub ring can be attached directly to the tower assembly 106. In such embodiment, an innermost diameter defined by the hub ring can be said to engirdle the tower structure base around its outer periphery.

A hub ring used in connection with the inventive embodiments is comprised of at least one reflector deployment mechanism which is configured to cause a predetermined deployment action of a plurality reflector ribs. According to one aspect, the deployment mechanism can facilitate a pivot action of a plurality of pivot members respectively associated with the plurality of ribs to facilitate their deployment. Any suitable reflector deployment mechanism which is now known or known in the future can be used for this purpose.

Figure 6:
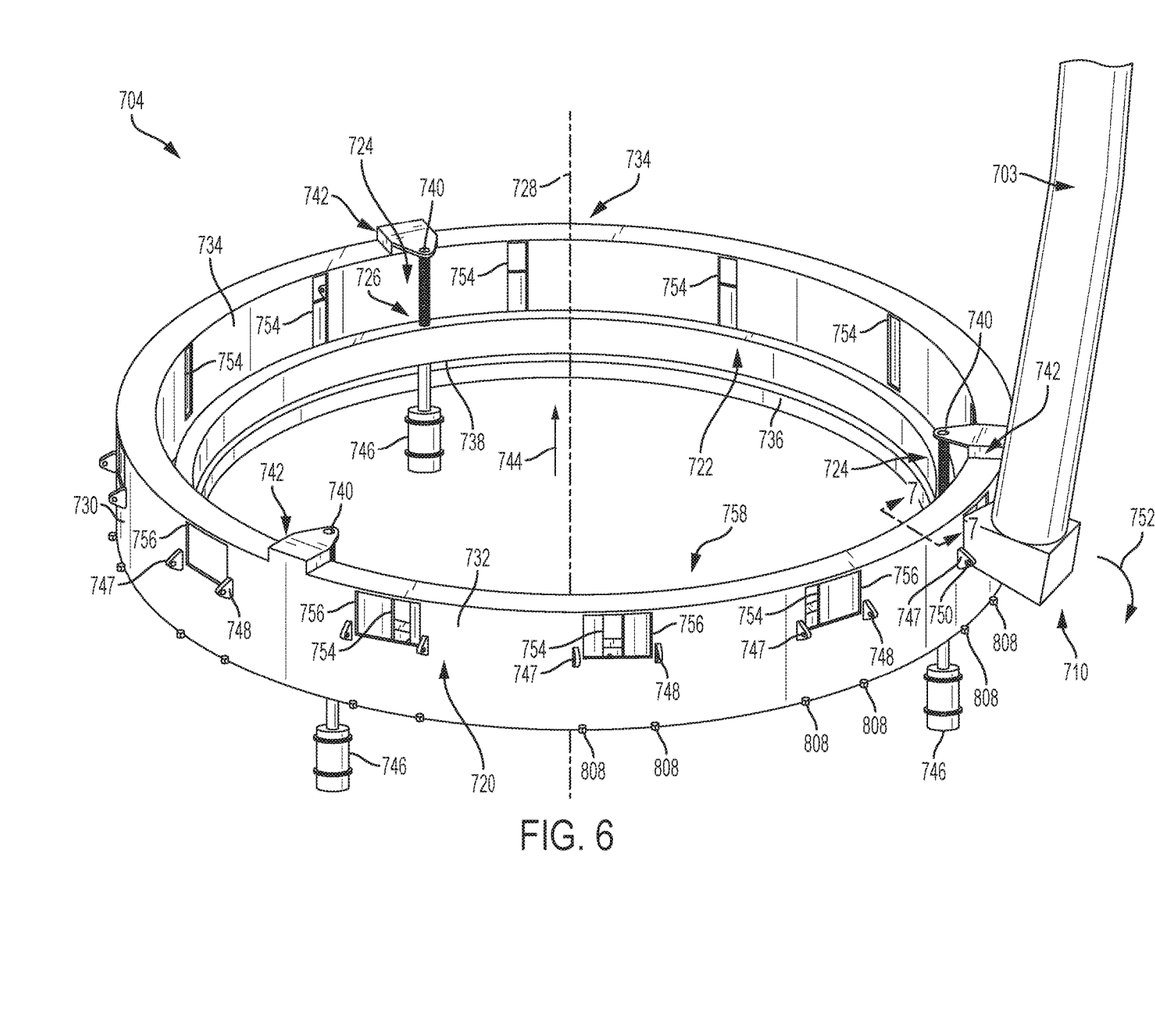
FIG. 6 is a drawing that is useful for understanding a hub ring of a deployable antenna reflector according to an embodiment.

Referring now to FIG. 6, an exemplary hub ring 704 is disclosed which can facilitate an embodiment of a modular antenna system as described in FIGS. 1-5. In FIG. 6, only one reflector rib 703 and its associated pivot member 710 is shown so as to facilitate greater clarity. However, it should be appreciated that an actual hub ring as described herein would include a plurality of pivot members 710 and ribs 704 in an arrangement similar to that which is shown in FIGS. 1-5.

The exemplary hub ring 704 is comprised of a pivot ring 720, a drive element and a plurality of drive screws 724. In the embodiment shown in FIG. 6, the drive element is comprised of a drive ring 722. Each of the pivot ring 720 and the drive ring 722 are toroidal shaped elements. According to one embodiment, the pivot ring 720 can have an L-shaped cross section. As such, the pivot ring 720 can include a side wall 730 having inner and outer sidewall surfaces 732, 734. In an exemplary embodiment, the inner and outer sidewall surfaces can each be substantially aligned with a central axis 728 of the hub ring. A lip 736 extends inwardly (toward the center of the pivot ring) from the side wall 730 in a direction which is transverse (e.g., perpendicular) to the central axis 728. A plurality of pivot tab pairs 747, 748 are disposed on the outer sidewall 732. Each of the pivot tab pairs 747, 748 include a bore in which is journaled a guide pin 750 associated with a pivot member 710. This arrangement comprises a hinge or pivot point about which the pivot member can pivot in a direction 752.

Bearings or guide apertures 738, 740 are disposed on the pivot ring 720 to support the drive screws 724. For example, a first set of guide apertures 738 can be disposed in the lip 736, and a second set of bearings or guide apertures 742 can be disposed in cantilever guide structures 742. Each guide aperture 738 is disposed in alignment with a corresponding guide aperture 740 so that a guide screw 724 supported therein is aligned with central axis 728. The drive ring 722 can have a substantially rectangular cross-section as shown in FIG. 6. As such, the drive ring can include inner and outer side walls which are aligned in a direction parallel to the central axis 728. Each of the drive screws 724 is threaded into a corresponding threaded bore 726 which extends through the drive ring 722 in a direction aligned with the central axis 728 of the hub ring. Accordingly, when the drive screws are rotated in a predetermined direction, the drive ring will move axially within the pivot ring 720 in a direction 744.

One or more drive motors 746 are secured to the pivot ring 720 so that one or more drive shafts respectively associated with the drive motors can cause each of the drive screws to rotate. Motors employing any suitable motor technology can be employed for this purpose. For example in some embodiments one or more electric motors can be provided. Operation of the drive motors can cause the drive ring 722 to move in direction 744 as described above. For example, the drive ring can initially be disposed in a first position adjacent to the lip 736 as shown in FIG. 6 when a satellite is in transit to an orbital destination. Later, when the satellite has reached its orbital destination, the drive ring can be moved to a second position shown in FIG. 8 in which the drive ring is spaced a predetermined distance from the first position.

Figure 7:
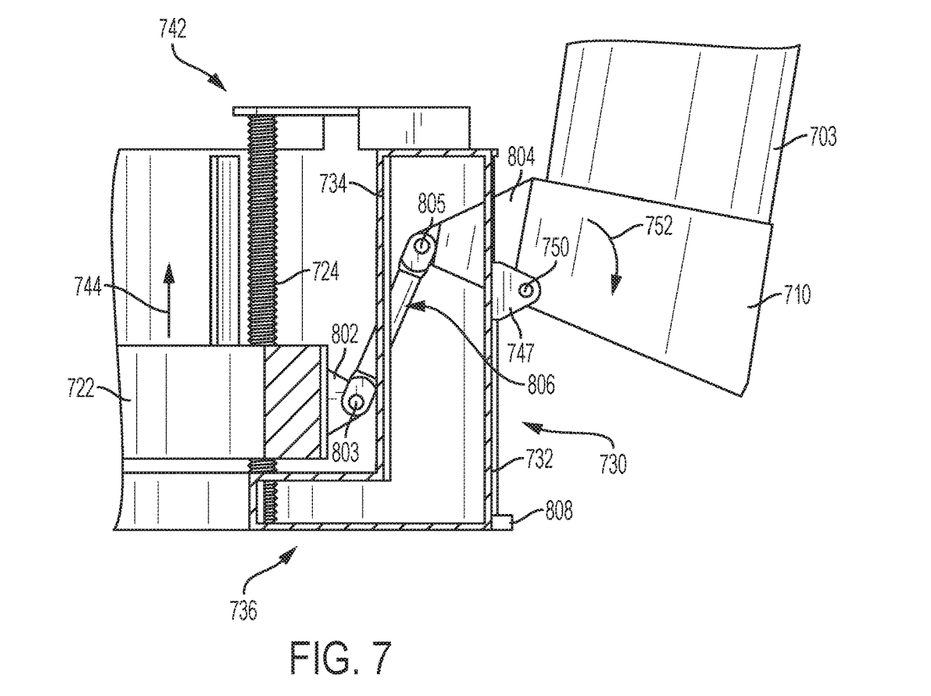
FIG. 7 is a cross-sectional view of the hub ring in FIG. 6 taken along line 7-7 with a reflector rib in a stowed configuration.
Figure 8:
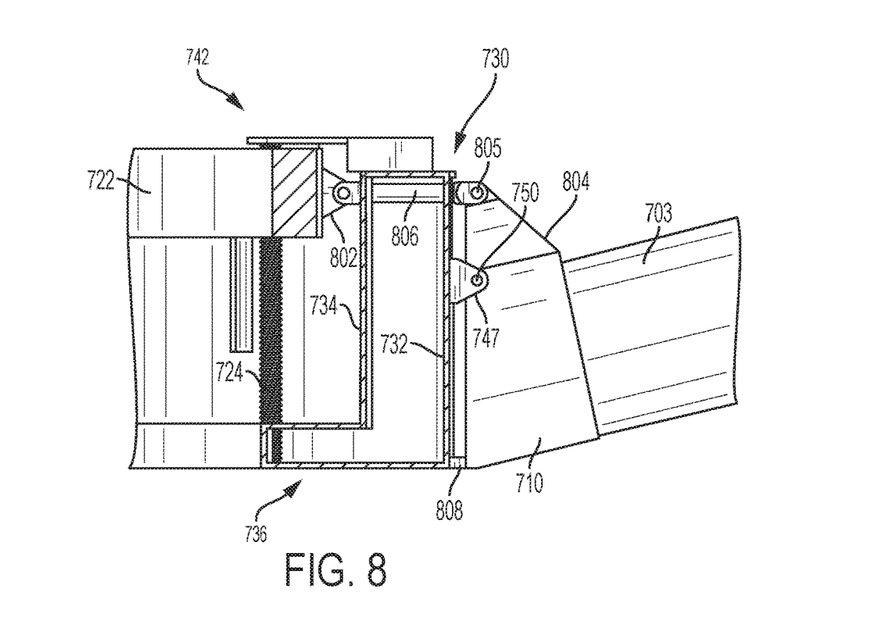
FIG. 8 is a cross-sectional view of the hub ring in FIG. 7 taken along line 7-7 with a reflector rib in a deployed position.

The drive ring 722 is mechanically coupled to each of the pivot members 710 to facilitate pivot motion of the pivot member when the ring moves in direction 744. Referring now to FIGS. 7 and 8, there is shown a cross-sectional view of the hub ring 704 taken along line 7-7 in FIG. 6. The cross-sectional views shown are useful for understanding an exemplary drive link coupling which connects the drive ring 722 to one of the pivot members 710. In practice, each pivot member 710 would be provided with a similar drive link coupling. Accordingly, a description of the drive link coupling shown in FIGS. 6 and 7 is sufficient for understanding an exemplary hub ring 704.

Each drive link coupling is comprised of a shoulder tab 802, a crank arm 804, and a drive link 806. The shoulder tab 802, crank arm 804 and drive link 806 can be arranged in the hub ring 704 so that they are radially aligned with the reflector rib 703. The shoulder tab 802 includes a bore through which a pin 803 is journaled so that the drive link 806 can pivot about the pin 803. Similarly, the crank arm 804 can include a bore through which a pin 805 is journaled so that the drive link can also pivot about the pin 805. The drive link 806 extends through an inner slot 754 formed on the inner side wall surface 734 and an outer slot 756 formed on the outer side wall surface 732 to connect the drive ring 722 to the pivot member 710. Consequently, motion of the drive ring 722 in direction 744 will exert a crank force on the crank arm 804. This motion will cause the pivot member 710 to rotate in direction 752 about an axis aligned with guide pin 750, from the stowed position shown in FIG. 7 to the deployed position shown in FIG. 8. When in the deployed position shown in FIG. 8, pivot member can be supported by pin 805, guide pin 750, and foot members 808 as shown.

From the foregoing it will be understood that a hub ring used in connection with the inventive embodiments is comprised of at least one reflector deployment mechanism which is configured to cause a predetermined deployment action of a plurality reflector ribs. The reflector deployment mechanism will generally require at least one drive element (such as drive ring 722). However, it should be appreciated that a deployment action of the ribs can be effected in various ways and the invention is not intended to be limited to the particular deployment mechanism shown in FIGS. 6-8. Other deployment mechanisms are possible and the invention is intended to include all such deployment mechanisms now known or known in the future, provided that they facilitate the systems and methods described herein for integration of a space vehicle with a reflector antenna. The use of a pivot ring 720 or equivalent structure will generally be advantageous to establish a relationship between the ribs and to facilitate deployment; but a drive ring 722 as described herein is not necessarily required. Other embodiments could eliminate the drive ring and instead utilize one or more alternative drive elements. For example, individual motors (not shown) could be attached to pivot ring. Each individual motor could be provided with a gear and a crank to exert a force upon each drive link 806. The resulting movement of each drive link 806 would thereby urge movement of each crank arm 804 and cause the required pivot action of each rib. In other embodiments, a single motor could be provided and the at least one drive element could include a drive belt, drive chain or multiple drive shafts (not shown) which are coupled to each rib. All such embodiments are contemplated within the scope of the present disclosure.

Figure 9:
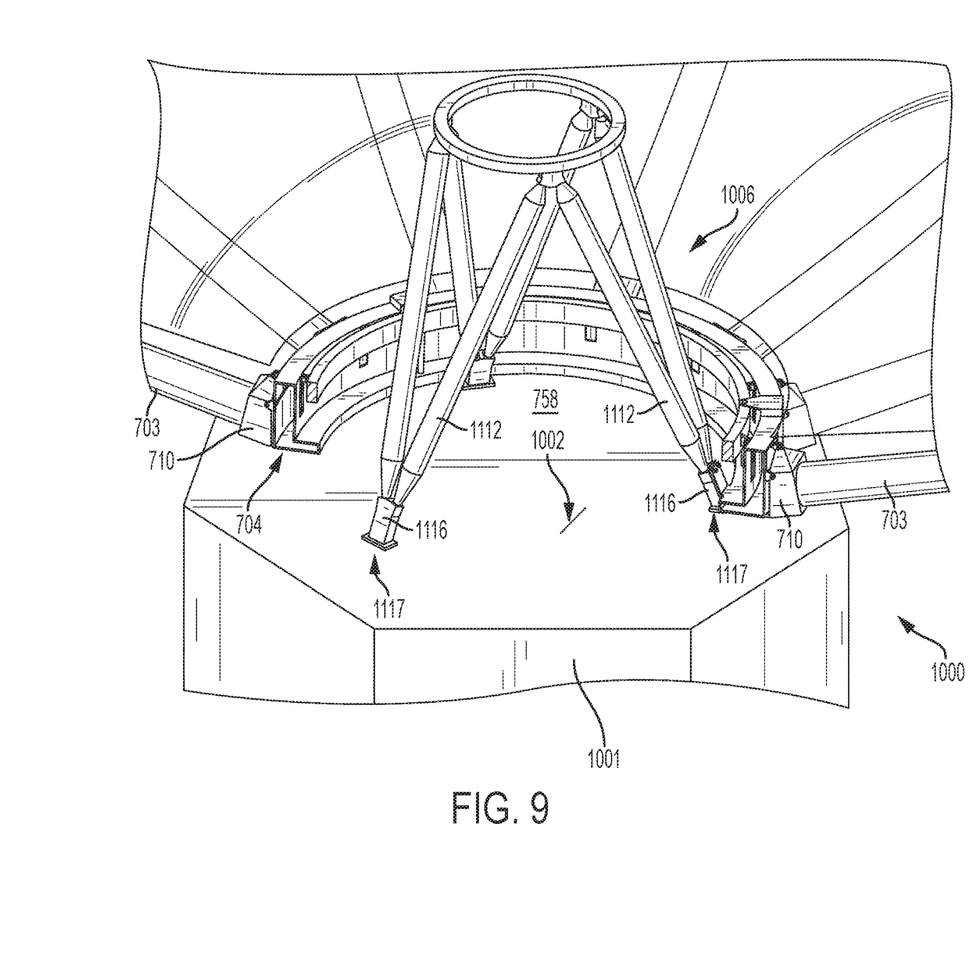
FIG. 9 is a partial cross-sectional view of the hub ring in FIG. 6 positioned on a feed tower which is mounted to a space vehicle bus.

Referring now to FIG. 9 there is shown a portion of a space vehicle 1000 which is similar to the embodiment space vehicle shown in FIGS. 4 and 5. In a conventional space vehicle, a hub ring for a deployable antenna reflector would be directly attached to the space vehicle bus at a plurality of structurally reinforced hub ring mounting points. But in the embodiment shown in FIG. 9, an antenna feed tower 1006 is mounted directly to the space vehicle bus 1001 and the hub ring is mounted to the antenna feed tower. In order to facilitate understanding of the embodiment shown in FIG. 9, an enlarged view of a portion of the space vehicle is shown in FIG. 10.

Figure 10:
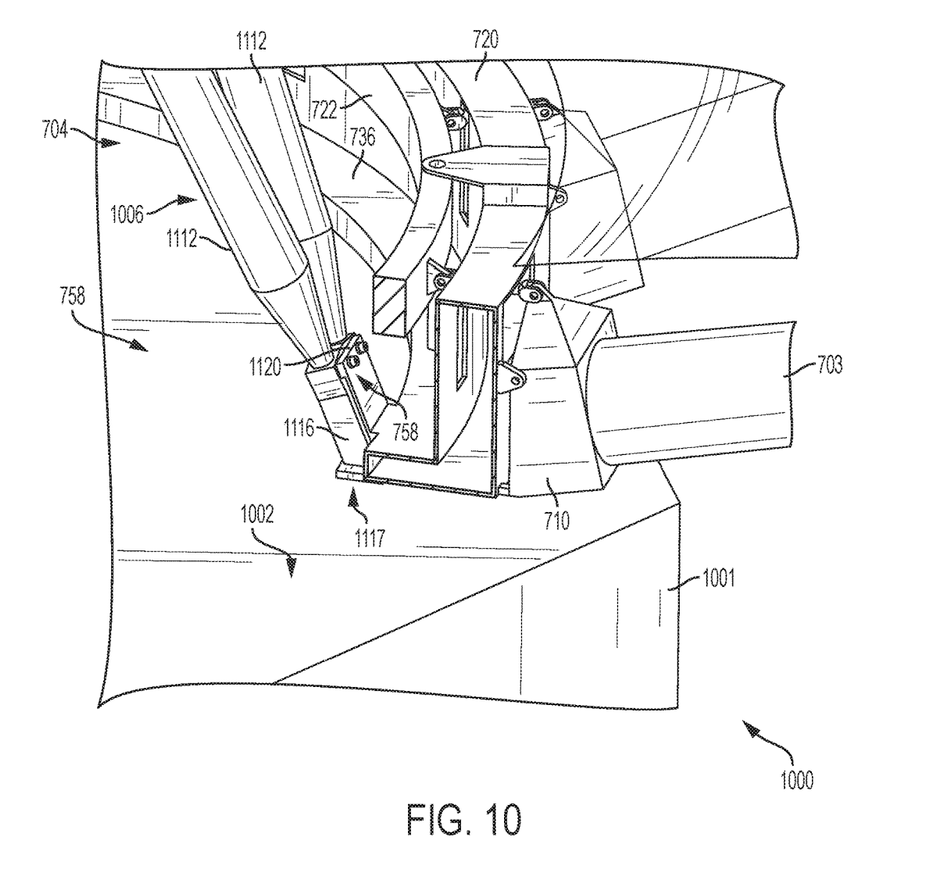
FIG. 10 is an enlarged cross-sectional view of a portion of the hub ring in FIG. 6, which shows details of how the hub ring is mounted on the feed tower.

Referring now to FIGS. 9 and 10, it can be observed that the antenna feed tower 1006 can be comprised of a plurality of legs 1112 and a plurality of feet 1116. The legs 1112 of the antenna feed tower 1006 are advantageously secured directly to the space vehicle bus 1001. For example, each foot 1116 of the antenna feed tower 1006 can be attached to the space vehicle bus 1001 at one of a plurality of structurally reinforced tower mounting points 1117 disposed on a tower mounting surface 1002. Each foot 1116 can be secured to the space vehicle bus 1001 by any suitable means now known or known in the future. For example, threaded fasteners (not shown) can be used for this purpose.

The space vehicle 1000 includes a hub ring which is arranged to deploy an antenna reflector. The hub ring is configured so that it can be added to the space vehicle 1000 after the antenna feed tower has already been secured to the vehicle. Accordingly, a complete electronic chassis testing of space vehicle 1000 can be facilitated in the absence of the reflector. Such testing can include testing and integration of electronics sub-assemblies disposed in the spacecraft bus 1001 and on the antenna feed tower 1006. According to one aspect, these advantages are facilitated by a hub ring which fits over the outer portions of the antenna feed tower 1006 as shown. An exemplary hub ring which can be used for this purpose is hub ring 704 described above in relation to FIGS. 6-8.

The hub ring 704 can include a plurality of mounting surfaces which are arranged to align with corresponding hub mounting surfaces disposed on the antenna tower. For example, a hub ring can have a plurality of mounting tabs 758 which define mounting surfaces which are arranged to align with corresponding hub mounting surfaces 1120 disposed on the antenna feed tower legs or feet. Suitable fastening elements such as screws can then be used to secure the mounting tabs 758 to the mounting surfaces 1120.

As may be observed in FIGS. 9 and 10, a hub ring 704 has a large, unobstructed central aperture 758 through which an antenna feed tower 1006 can be inserted after the reflector is fully assembled and tested. Consequently testing of the integrated space vehicle electronics system (including the electronics sub-assemblies in the space vehicle bus 1001 and on the antenna feed tower 1006) can occur in parallel with development, assembly and test of the reflector. When each of these components is fully independently assembled and tested, the reflector can be mounted to the antenna feed tower without disturbing any of the connections of the already tested space vehicle electronics system.

Figure 11:
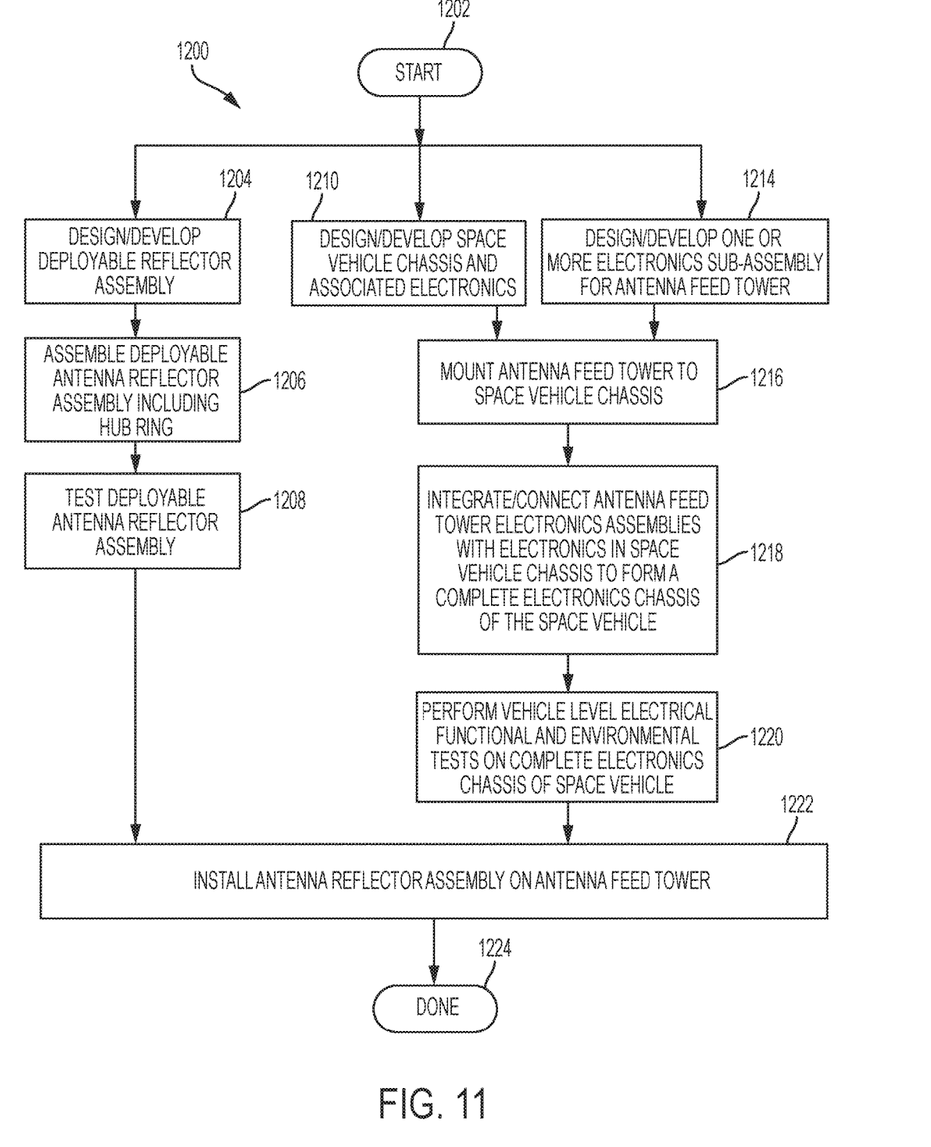
FIG. 11 is a flow chart that is useful for understanding how a space vehicle test and integration process can be made more efficient.

Referring now to FIG. 11, a space vehicle assembly process 1200 is disclosed. The process begins in step 1202 and continues at steps 1204, 1210, 1214 which can occur in parallel. At 1204 a deployable antenna reflector assembly is designed and/or developed. At 1206, the deployable antenna reflector assembly including the hub ring can be assembled. In 1208, the deployable antenna reflector assembly can be tested. Concurrent with steps 1204, 1206 and 1208, one or more of steps 1210, 1214, 1216, 1218 and 1220 can be performed. For example, in step 1210 design and development of a space vehicle bus and associated electronics can be performed. Concurrently, in step 1214 one or more electronics sub-assemblies associated with an antenna feed tower can be designed and developed. In step 1216, the antenna feed tower (including feed tower electronics) can be mounted to the space vehicle bus. The antenna feed tower electronics can be connected or integrated at 1218 with electronics assemblies in the space vehicle bus to form a completed space vehicle electronics system. Thereafter, vehicle level electrical functional and environmental testing can be performed on the integrated space vehicle electronics system at 1220. At the appropriate time, the antenna reflector assembly can be installed on the antenna feed tower in step 1222. The process can end at 1224 or can continue with additional processing.

An embodiment of the invention has been described with respect to FIGS. 1-11 in which a hub ring of a deployable antenna reflector assembly is exclusively mounted directly to the antenna tower, and such mounting is performed only after the tower has been mounted to the space vehicle bus. However, in an alternative embodiment, hub ring can also be attached to the portions of the space vehicle bus. For example, in FIG. 10, if the hub ring 704 is situated on the antenna feed tower so that lip 736 is adjacent to the mounting surface 1002, then the lip can further include one or more attachment points (not shown) through which the hub ring 704 may also be directly attached to portions of the space vehicle bus 1001. Such attachment points can be in addition to the hub mounting surfaces 1120 provided on the antenna feed tower. As a further alternative, the antenna tower assembly and the hub ring associated with the antenna reflector assembly can each be independently mounted to the space vehicle bus. In such an arrangement, the hub ring would still be provided as a modular assembly and would be similar to the hub ring 704 described herein with respect to FIGS. 6, 7 and 8. However, if the hub ring has a large enough central aperture 758 it can be arranged so as to be disposed around the antenna feed tower without necessarily being mounted to or contacting same.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

We claim:

1. A method for integration of a space vehicle with a reflector antenna, comprising:
   mounting to a space vehicle bus an antenna feed tower for a reflector antenna assembly, whereby the antenna feed tower is integrated with the space vehicle without the reflector antenna;
   integrating at least a first active electronics assembly disposed on the antenna feed tower with at least a second active electronics assembly disposed in the space vehicle bus to form an integrated space vehicle electronics system;
   performing functional testing of the integrated space vehicle electronics system; and
   positioning a hub ring of a deployable antenna reflector to engirdle the antenna feed tower after said functional testing.

2. The method according to claim 1, further comprising selecting the arrangement of the hub ring to extend exclusively around an outer periphery of the antenna feed tower.

3. The method according to claim 1, further comprising structurally securing the hub ring to at least one of the antenna feed tower and the space vehicle bus.

4. The method according to claim 3, wherein the securing step further comprises positioning a plurality of hub ring structural attachment sites disposed around an inner peripheral portion of the hub ring, to align with a corresponding plurality of tower structural attachment sites disposed around an outer periphery of the antenna feed tower.

5. The method according to claim 3, wherein the securing step is performed exclusive of disassembly of the integrated space vehicle electronics assembly.

6. The method according to claim 3, wherein the securing step is performed exclusive of disassembly of the antenna feed tower from the space vehicle bus.

7. A method for integration of a space vehicle with a reflector antenna, comprising:
mounting to a space vehicle bus an antenna feed tower for a reflector antenna assembly;
integrating at least a first electronics assembly disposed on the antenna feed tower with at least a second electronics assembly disposed in the space vehicle bus to form an integrated space vehicle electronics system;
performing functional testing of the integrated space vehicle electronics system; and
positioning a hub ring of a deployable antenna reflector to engirdle the antenna feed tower after said functional testing;
arranging the hub ring to include a pivot ring having an outer ring periphery around which a plurality of reflector ribs are disposed to pivot, and at least one drive element operatively coupled to the reflector ribs.

8. The method according to claim 7, further comprising coupling the at least one drive element to a plurality of pivot members associated with the plurality of reflector ribs to cause the reflector ribs to pivot when the at least one drive element transitions from a first position to a second position.

9. A modular center fed reflector antenna system, comprising:
a feed tower assembly comprising at least one active electronic component and an elongated antenna feed tower structure having a tower base at one end which includes a plurality of feet arranged to align with a plurality of predetermined structural mounting points associated with a space vehicle bus;
a deployable reflector assembly comprising a hub ring including a reflector deployment mechanism around which a plurality of reflector ribs are disposed to pivot when the deployable reflector is to be deployed;
wherein the hub ring engirdles the feed tower assembly and has a central aperture free of obstructions, whereby the central aperture is configured to receive the feed tower assembly therein.

10. The modular center fed reflector antenna system according to claim 9, wherein the hub ring extends exclusively around an outer periphery of the tower base.

11. The modular center fed reflector antenna according to claim 9, further comprising at least a first electronics assembly disposed on a portion of the elongated antenna feed tower structure opposed from the tower base and configured to integrate with at least a second electronics assembly provided in the space vehicle bus to facilitate operation of a reflector antenna system.

12. The modular center fed reflector antenna system according to claim 9, wherein the hub ring further includes a plurality of hub ring structural attachment sites disposed around an inner peripheral portion of the hub ring, the hub ring structural attachment sites arranged to align with plurality of tower structural attachment sites disposed around an outer periphery of the antenna feed tower to facilitate attachment of the hub ring to the antenna feed tower structure.

13. A modular center fed reflector antenna system, comprising:
a feed tower assembly comprising an elongated antenna feed tower structure having a tower base at one end which includes a plurality of feet arranged to align with a plurality of predetermined structural mounting points associated with a space vehicle bus;
a deployable reflector assembly comprising a hub ring including a reflector deployment mechanism around which a plurality of reflector ribs are disposed to pivot when the deployable reflector is to be deployed;
wherein the hub ring engirdles the feed tower assembly and has a central aperture free of obstructions, whereby the central aperture is configured to receive the feed tower assembly therein;
wherein the hub ring is comprised of a pivot ring having an outer periphery around which a plurality of reflector ribs are disposed to pivot, and at least one drive element operatively coupled to the plurality of reflector ribs.

14. The modular center fed reflector antenna system according to claim 13, further comprising a plurality of drive links which are arranged to couple the at least one drive element to each of a plurality of pivot members, each of the pivot members respectively associated with one of the plurality of reflector ribs.

15. The modular center fed reflector antenna system according to claim 14, wherein the plurality of pivot members are responsive to the plurality of drive links to respectively cause the plurality of reflector ribs to pivot when the at least one drive element transitions from a first position to a second position.

16. A space vehicle, comprising:
a space vehicle bus; and
a modular center fed reflector antenna system comprising:
a feed tower assembly comprising at least one active electronic component and an elongated antenna feed tower structure having a tower base at one end which includes a plurality of feet attached to the space vehicle bus at a plurality of predetermined tower structural mounting points associated with the space vehicle bus;
a deployable reflector assembly comprising a hub ring including a reflector deployment mechanism around which a plurality of reflector ribs are disposed to pivot when the deployable reflector is to be deployed;
wherein the hub ring engirdles the feed tower assembly and has a central aperture free of obstructions, whereby the central aperture is configured to receive the feed tower assembly therein.

17. The space vehicle according to claim 16, further comprising at least a first electronics assembly disposed on a portion of the elongated antenna feed tower structure opposed from the tower base and configured to integrate with at least a second electronics assembly provided in the space vehicle bus to facilitate operation of a reflector antenna system.

18. The space vehicle according to claim 16, wherein the hub ring further includes a plurality of hub ring structural attachment sites disposed around an inner peripheral portion of the hub ring, the hub ring structural attachment sites arranged to align with plurality of tower structural attachment sites disposed around an outer periphery of the antenna feed tower at which the hub ring is attached to the antenna feed tower structure.

19. A space vehicle, comprising:
- a space vehicle bus; and
- a modular center fed reflector antenna system comprising:
- a feed tower assembly comprising an elongated antenna feed tower structure having a tower base at one end which includes a plurality of feet attached to the space vehicle bus at a plurality of predetermined tower structural mounting points associated with the space vehicle bus;
- a deployable reflector assembly comprising a hub ring including a reflector deployment mechanism around which a plurality of reflector ribs are disposed to pivot when the deployable reflector is to be deployed;
- wherein the hub ring engirdles the feed tower assembly and has a central aperture free of obstructions, whereby the central aperture is configured to receive the feed tower assembly therein;
- wherein the hub ring is comprised of a pivot ring having an outer periphery around which a plurality of reflector ribs are disposed to pivot, and at least one drive element operatively coupled to the plurality of reflector ribs.

20. The space vehicle according to claim 19, further comprising a plurality of drive links which are arranged to couple the at least one drive element to each of a plurality of pivot members, each of the pivot members respectively associated with one of the plurality of reflector ribs.

* * * * *